(12) United States Patent
Jeong

(10) Patent No.: US 7,957,213 B2
(45) Date of Patent: *Jun. 7, 2011

(54) SEMICONDUCTOR MEMORY APPARATUS

(75) Inventor: Bong-Hwa Jeong, Gyeonggi-do (KR)

(73) Assignee: Hynix Semiconductor, Inc. (KR)

( * ) Notice: Subject to any disclaimer, the term of this patent is extended or adjusted under 35 U.S.C. 154(b) by 43 days.

This patent is subject to a terminal disclaimer.

(21) Appl. No.: 12/469,974

(22) Filed: May 21, 2009

(65) Prior Publication Data

US 2009/0225620 A1   Sep. 10, 2009

Related U.S. Application Data

(63) Continuation-in-part of application No. 11/647,477, filed on Dec. 29, 2006, now Pat. No. 7,548,480.

(30) Foreign Application Priority Data

Feb. 9, 2006 (KR) .................. 10-2006-0012357

(51) Int. Cl.
*G11C 5/14* (2006.01)
(52) U.S. Cl. ............... 365/226; 365/227; 365/189.09
(58) Field of Classification Search .......... 365/226, 365/227, 189.09
See application file for complete search history.

(56) References Cited

U.S. PATENT DOCUMENTS

| 6,166,077 | A | 12/2000 | De Simone |
| 6,169,698 | B1 | 1/2001 | Sukegawa et al. |
| 6,198,671 | B1 | 3/2001 | Aoyama et al. |
| 6,275,439 | B1 | 8/2001 | Lee |
| 6,385,115 | B1 | 5/2002 | Nakai |
| 6,778,460 | B1 | 8/2004 | Jung |
| 6,879,197 | B2 | 4/2005 | Kang et al. |
| 6,891,773 | B2 * | 5/2005 | Park .................. 365/230.06 |
| 6,922,369 | B2 | 7/2005 | Kim |
| 6,925,025 | B2 | 8/2005 | Deng et al. |
| 7,113,440 | B2 | 9/2006 | Lee et al. |
| 7,301,848 | B2 | 11/2007 | Jin |
| 7,339,849 | B2 | 3/2008 | Jeong |
| 7,382,666 | B2 | 6/2008 | Lee |
| 7,391,666 | B2 | 6/2008 | Raad |
| 2005/0243624 | A1 | 11/2005 | Jang |
| 2006/0023534 | A1 | 2/2006 | Do |
| 2006/0077744 | A1 * | 4/2006 | Song .................... 365/226 |

FOREIGN PATENT DOCUMENTS

| JP | 2000-149566 | 5/2000 |
| KR | 1020030048291 | 6/2003 |
| KR | 1020030081979 | 10/2003 |
| KR | 1020050009012 | 1/2005 |

* cited by examiner

*Primary Examiner* — Huan Hoang
(74) *Attorney, Agent, or Firm* — Venable LLP; Jeffri A. Kaminski

(57) ABSTRACT

A semiconductor memory apparatus includes: a compensation voltage input node; a core voltage generator configured to generate a core voltage using an external power source voltage and supply the core voltage to the compensation voltage input node; a compensation controlling unit configured to generate a compensation control signal to determine power compensation, in response to a refresh signal; a power compensating unit configured to selectively supply the external power source voltage to the compensation voltage input node in response to the compensation control signal; and a power supply unit configured to supply a voltage at the compensation voltage input node or the external power source voltage to a sense-amp driver in response to a first power control signal or a second power control signal.

10 Claims, 4 Drawing Sheets

SEMICONDUCTOR MEMORY APPARATUS

CROSS-REFERENCE TO RELATED APPLICATIONS

This U.S. non-provisional patent application claims priority under 35 U.S.C. §119 of U.S. patent application Ser. No. 11/647,477 filed on Dec. 29, 2006, the entire contents of which are hereby incorporated by reference.

BACKGROUND OF THE INVENTION

1. Technical Field

The present invention relates to a semiconductor memory apparatus, and in particular to a semiconductor memory apparatus which enhance the drivability of a sense amplifier driver during a refresh operation.

2. Related Art

In general, a memory cell of a dynamic random access memory (DRAM) is composed of one transistor and one capacitor. A sensing operation is carried out by selecting the memory cell with a word line coupled to a gate terminal of the transistor, and amplifying a voltage applied to the source terminal of the transistor by the capacitor coupled to the drain terminal of the transistor. During this operation, DRAM conducts an over-drive operation to charge a selected bit line up to a target level by sensing a memory cell more quickly. Namely, when the voltage of a bit line is changed to a core voltage level, an external power source voltage is supplied to the bit line to make the voltage of the bit line rapidly rise up to the core voltage level.

The bit-line sensing operation in DRAM is also carried out in a refresh mode, in addition to normal input/output modes. However, in the refresh mode, the external power source voltage to the bit line is interrupted, reducing current dissipation.

FIG. 1 is a block diagram of a semiconductor memory apparatus according to the conventional art.

The semiconductor memory apparatus shown in FIG. 1 includes a power supply controlling unit 10 that selectively outputs a first power control signal VSC_1 or a second power control signal VSC_2 in response to a refresh signal REF for determining a refresh operation and an active signal ACT that determines a bit-line sensing operation by a sense amplifier; a power supply unit 20 that selectively outputs an external power source voltage VDD or a core voltage Vcore in response to the first power control signal VSC_1 or the second power control signal VSC_2; a sense-amp driver 30 that supplies the sense amplifier with the external power source voltage VDD or the core voltage Vcore provided by the power supply circuit 20; and a core voltage generator 40 that generates the core voltage Vcore using the external power source voltage VDD.

When the semiconductor memory apparatus is not in the refresh mode, the refresh signal REF is disabled. During this time, if the active signal ACT becomes enabled, the first power control signal VSC_1 is output from the power supply controlling unit 10, and is enabled for a predetermined time. Then, after the predetermined time, the first power control signal VSC_1 is disabled and the second power control signal VSC_2 is enabled. When the active signal ACT is disabled, the second power control signal VSC_2 is disabled.

On the contrary, when the semiconductor memory apparatus is in the refresh mode, the refresh signal is enabled. During this time, if the active signal ACT is enabled, the second power control signal VSC_2 is output from the power supply controlling unit 10, and is enabled for a predetermined time. Thereafter, if the active signal ACT is disabled, the second power control signal VSC_2 is disabled.

The power supply unit 20 supplies the external power source voltage VDD to the sense-amp driver 30 when the first power control signal VSC_1 is enabled, while it supplies the core voltage Vcore to the sense-amp driver 30 when the second power control signal VSC_2 is enabled.

The sense-amp driver 30 supplies the sense amplifier with the external power source voltage VDD or the core voltage Vcore.

On the other hand, the core voltage Vcore generated by the core voltage generator 40 is a voltage used as a power source voltage in a core circuit region of the semiconductor memory apparatus.

As such, in the conventional art, during an active operation in the normal mode of the semiconductor memory apparatus, the over-drive function is enabled to supply the external power source voltage VDD to the sense-amp driver 30 to efficiently sense a bit line. During an active operation in the refresh mode of the semiconductor memory apparatus, the core voltage Vcore is supplied to the sense-amp driver 30 without enabling the over-drive operation to reduce power consumption. However, since the core voltage Vcore is used in a plurality of memory banks, the drivability of the bit-line sensing is degraded so a selected bit line hardly reaches the level of the core voltage Vcore in a predetermined time, resulting in a malfunction in sensing the selected bit line.

SUMMARY

Embodiments of the present invention provide a semiconductor memory apparatus, which enhances a drivability of a sense-amp driver by raising a voltage to be supplied into a sense amplifier during an active operation in a refresh mode.

An embodiment of the present invention provides a semiconductor memory apparatus including: a compensation voltage input node; a core voltage generator configured to generate a core voltage using an external power source voltage and supply the core voltage to the compensation voltage input node; a compensation controlling unit configured to generate a compensation control signal to determine power compensation, in response to a refresh signal; a power compensating unit configured to selectively supply the external power source voltage to the compensation voltage input node in response to the compensation control signal; and a power supply unit configured to supply a voltage at the compensation voltage input node or the external power source voltage to a sense-amp driver in response to a first power control signal or a second power control signal.

Another embodiment of the present invention provides a semiconductor memory apparatus including: a compensation voltage input node; a core voltage generator configured to generate a core voltage using an external power source voltage and supply the core voltage to the compensation input node; a power supply compensation unit configured to selectively supply the external power source voltage to the compensation voltage input node in response to a refresh signal; and a power supply unit configured to selectively supply a voltage at the compensation voltage input node or the external power source voltage to a sense-amp driver in response to a first power control signal or a second power control signal.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF EXEMPLARY EMBODIMENT

Figure 1:
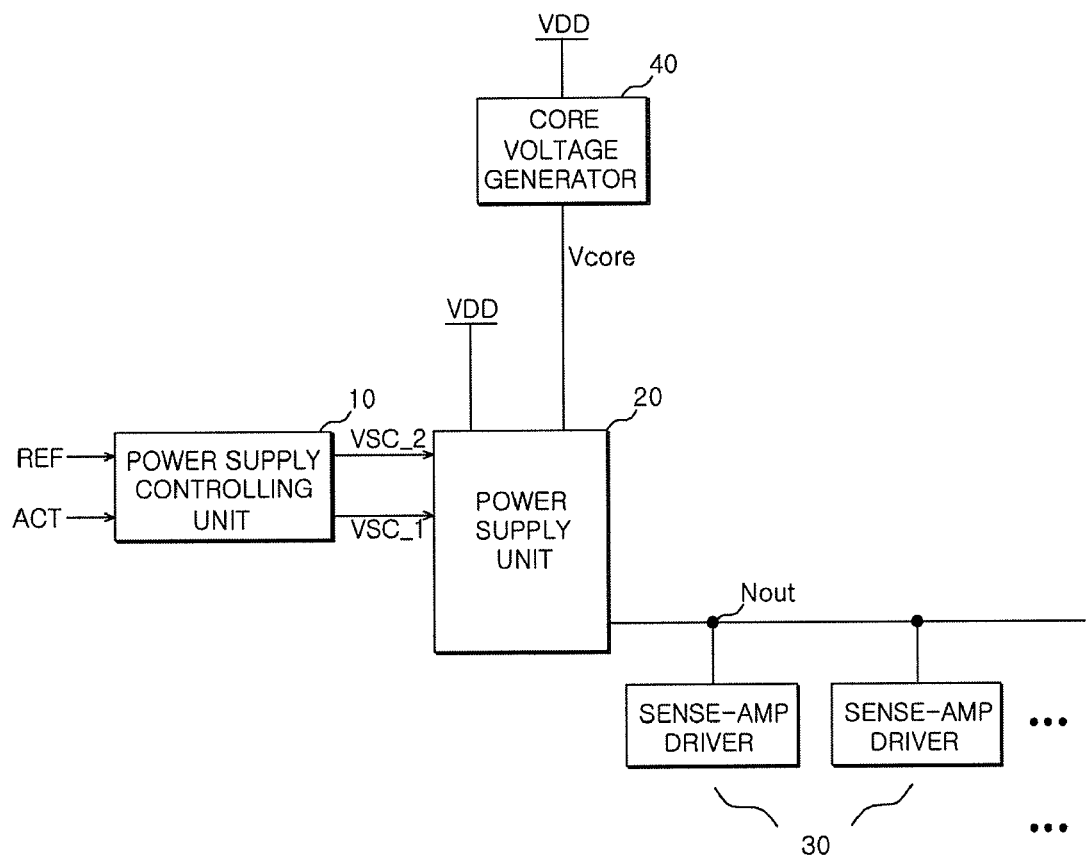
FIG. 1 is a block diagram of a semiconductor memory apparatus according to the conventional art.

Preferred embodiments of the present invention will be described below in more detail with reference to the accompanying drawings. The present invention may, however, be embodied in different forms and should not be constructed as being limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 2:
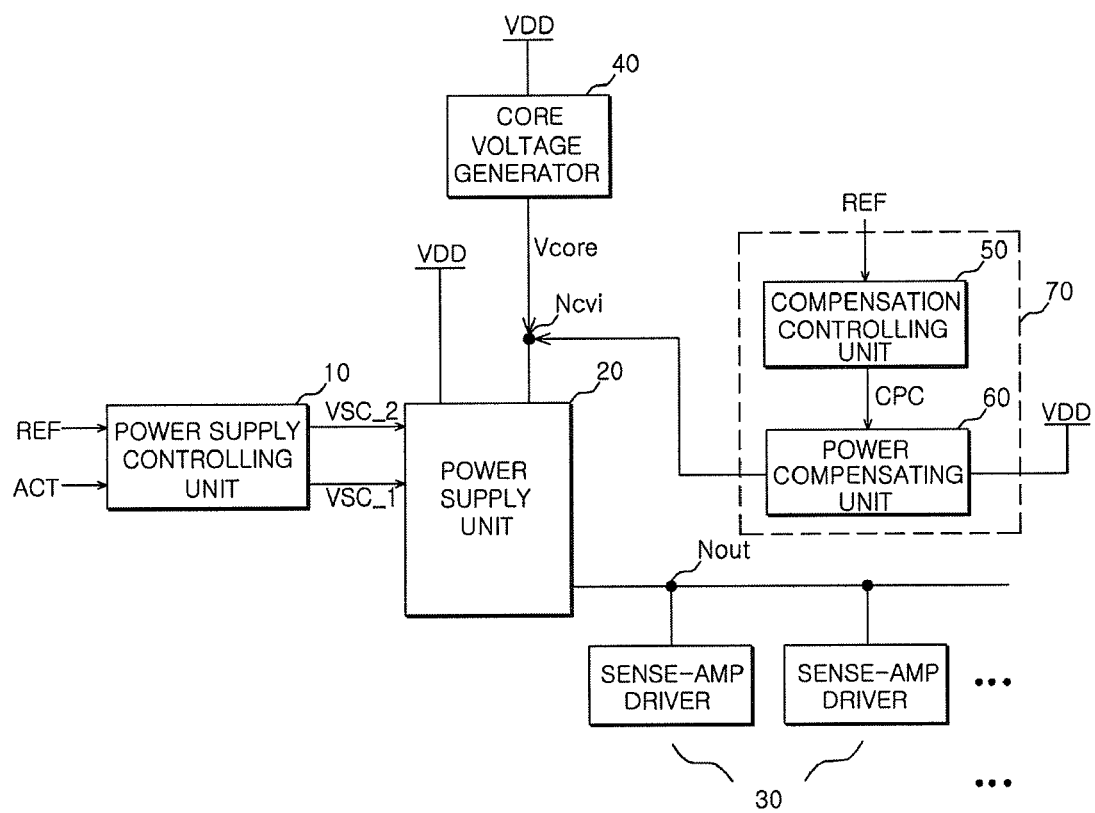
FIG. 2 is a block diagram of a semiconductor memory apparatus according to an embodiment of the present invention.

FIG. 2 is a block diagram of a semiconductor memory apparatus according to an embodiment of the present invention.

Referring to FIG. 2, the semiconductor memory apparatus includes a power supply controlling unit 10 that selectively outputs a first power control signal VSC_1 or a second power control signal VSC_2 in response to a refresh signal REF that determines a refresh operation and an active signal ACT that determines a bit-line sensing operation by a sense amplifier; a power supply unit 20 that selectively outputs a voltage at a compensation voltage input node Ncvi or an external power source voltage VDD in response to the first power control signal VSC_1 or the second power control signal VSC_2; a sense-amp driver 30 that supplies the voltage provided by the power supply unit 20 to the sense amplifier; a core voltage generator 40 that generates a core voltage Vcore using the external power source voltage VDD and supplies the core voltage Vcore to the compensation voltage input node; and a voltage supply compensation unit 70 that supplies the external power source voltage VDD to the compensation voltage input node Ncvi in response to the refresh signal REF.

The power supply compensation unit 70 includes a compensation controlling unit 50 that generates a compensation control signal CPC to determine power compensation in response to the refresh signal REF, and a power compensating unit 60 that supplies the external power source voltage VDD to the compensation voltage input node Ncvi in response to the compensation control signal CPC.

When the semiconductor memory apparatus is not in the refresh mode, the refresh signal REF is disabled. If the active signal ACT is enabled, the power supply controlling unit 10 outputs the first power control signal VSC_1 in an enabled state for a predetermined time. Then, after the predetermined time, the first power control signal VSC_1 is disabled and the second power control signal VSC_2 is enabled. When the active signal ACT is disabled, the second power control signal VSC_2 is disabled.

The power supply unit 20 supplies the external power source voltage VDD to the sense-amp driver 30 when the first power control signal VSC_1 is enabled, while it supplies the voltage at the compensation voltage input node Ncvi to the sense-amp driver 30 when the second power control signal VSC_2 is enabled.

On the other hand, when the semiconductor memory apparatus is in the refresh mode, the refresh signal is enabled. The compensation controlling unit 50 generates and outputs the compensation control signal CPC. When the compensation control signal CPC is enabled, the power compensating unit 60 supplies the external power source voltage VDD to the compensation voltage input node Ncvi which has been applied with the core voltage Vcore. By supplying the external power source voltage VDD to the compensation voltage input node Ncvi, the compensation voltage input node Ncvi has a voltage between the external power source voltage VDD and the core voltage Vcore. If the active signal ACT is enabled, the power supply controlling unit 10 outputs the second power control signal VSC_2 in an enabled state. Thus, the power supply unit 20 provides the sense-amp driver 30 with the voltage of the compensation voltage input node Ncvi. If the active signal ACT is disabled, the second power control signal VSC_2 is disabled. Thus the power provided from the power supply unit 20 is no longer supplied to the sense-amp. The time for supplying the voltage at the compensation voltage input node Ncvi to the sense-amp driver 30 is determined by an active time of the compensation control signal CPC generated from the compensation controlling unit 50.

The sense-amp driver 30 supplies the external power source voltage VDD or a voltage transferred from the compensation voltage input node Ncvi to the sense amplifier with.

On the other hand, the core voltage Vcore generated by the core voltage generator 40 is a voltage used as a power source voltage in a core circuit region of the semiconductor memory apparatus. Generally, the semiconductor memory apparatus includes the core circuit region and a peripheral circuit region.

Figure 3:
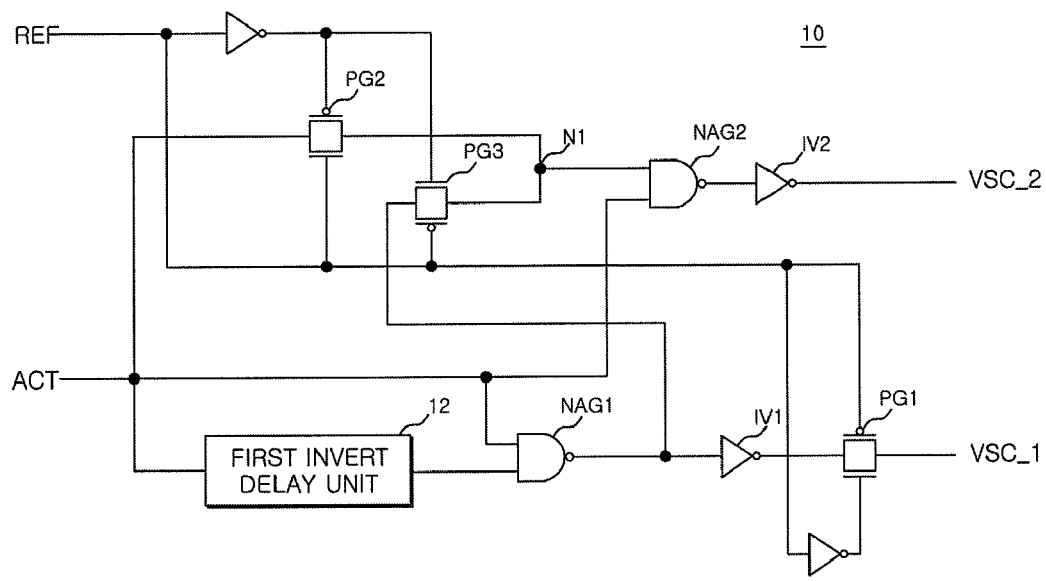
FIG. 3 is a circuit diagram of the power supply controlling unit shown in FIG. 2.

The power supply controlling unit 10, as shown in FIG. 3, includes a first invert delay unit 12 that inverts and delays the active signal ACT; a first NAND gate NAG1 that receives the active signal ACT and an output signal of the first invert delay unit 12; a first inverter IV1 that outputs the first power control signal VSC_1 by inverting an output signal of the first NAND gate NAG1; a first pass gate PG1 that outputs the first power control signal VSC_1 when the refresh signal REF becomes disabled; a second pass gate PG2 that transfers the active signal ACT to a node N1 when the refresh signal REF becomes enabled; a third pass gate PG3 that transfers the output signal of the first NAND gate NAG1 to the node N1 when the refresh signal REF becomes disabled; a second NAND gate NAG2 that receives the active signal ACT and a signal transferred to the node N1; and a second inverter IV2 that outputs the second power control signal VSC_2 by inverting an output signal of the second NAND gate NAG2.

When the active signal ACT is disabled, the first and second power control signals VSC_1 and VSC_2 output from the first and second inverters INV1 and INV2 are disabled. Meanwhile, when the active signal ACT is enabled, the first and second power control signals VSC_1 and VSC_2 are enabled depending on the state of the refresh signal REF.

When both the refresh signal REF and the active signal ACT are enabled, the first pass gate PG1 is turned off to disable the first power control signal VSC_1. The two signals input to the second NAND gate NAG2 are both the active signal ACT. Thus, the second power control signal VSC_2 is enabled.

On the other hand, when the active signal ACT is enabled while the refresh signal REF is disabled, the first pass gate PG1 is turned on to output the first power control signal VSC_1, which is enabled for a predetermined amount of time. This predetermined time is determined by a delaying time of the active signal ACT delayed by the first invert delay unit 12. During the predetermined time, the second power control signal VSC_2 is disabled. After period of the predetermined time, the first power control signal VSC_1 is disabled and the second power control signal VSC_2 is enabled. Namely, the active period of the first power control signal VSC_1 is used to establish an over-drive period of the bit-line sensing operation.

Figure 4:
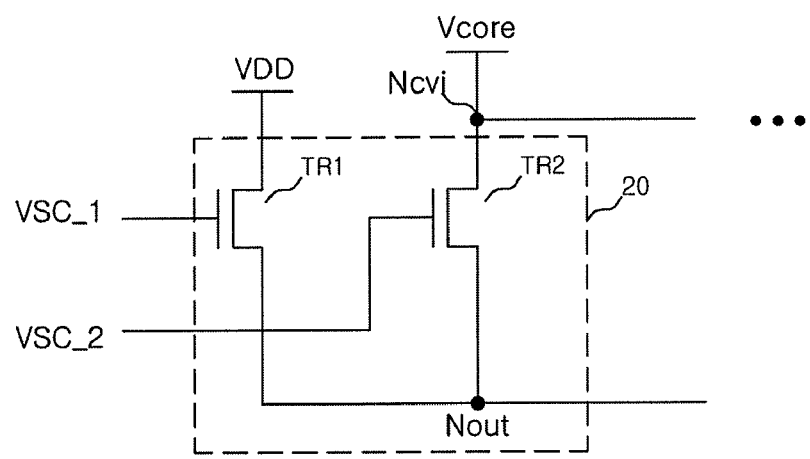
FIG. 4 is a circuit diagram of the power supply unit shown in FIG. 2.

Referring to FIG. 4, the power supply unit 20 includes a first transistor TR1 and a second transistor TR2. The first transistor TR1 has a gate terminal receiving the first power control signal VSC_1, a drain terminal applied with the external power source voltage VDD, and a source terminal coupled with an output terminal Nout. The second transistor TR2 has a gate terminal receiving the second power control signal VSC_2, a drain terminal applied with the compensation voltage input node Ncvi, and a source terminal coupled with the output terminal Nout.

The first and second power control signals VSC_1 and VSC_2 are not enabled at the same time. First, when the first power control signal VSC_1 is enabled, the first transistor TR1 is turned on while the second transistor TR2 is turned off. Thus, the external power source voltage VDD is transferred to the output terminal Nout. Similarly, when the second power control signal VSC_2 is enabled, the second transistor TR2 is turned on while the first transistor TR1 is turned off. Thus, the voltage at the compensation voltage input node Ncvi is transferred to the output terminal Nout. The voltage transferred to the output terminal Nout is supplied to the sense-amp driver 30 through a power supply line for the bit-line sensing operation.

Figure 5:
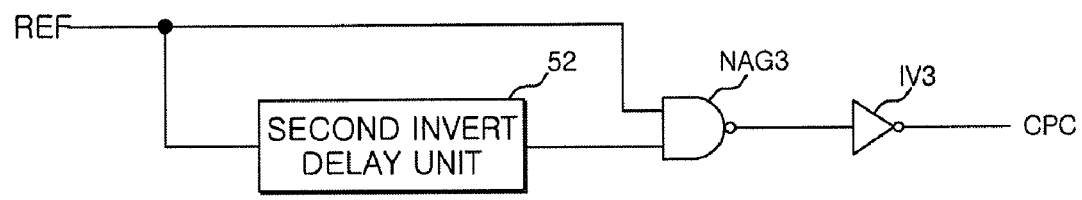
FIG. 5 is a circuit diagram of the compensation controlling unit shown in FIG. 2.

Referring to FIG. 5, the compensation controlling unit 50 includes a second invert delay unit 52 that inverts and delays the refresh signal REF; a third NAND gate NAG3 that receives the refresh signal REF and a signal output from the second invert delay unit 52; and a third inverter IV3 that generates the compensation control signal CPC by inverting an output signal of the third NAND gate NAG3.

The compensation control signal CPC is enabled at the time when the refresh signal REF is enabled, and is disabled after period of a predetermined time. A period that the compensation control signal CPC is enabled, is determined by the delaying time of the second invert delay unit 52 for delaying the refresh signal REF.

Figure 6:
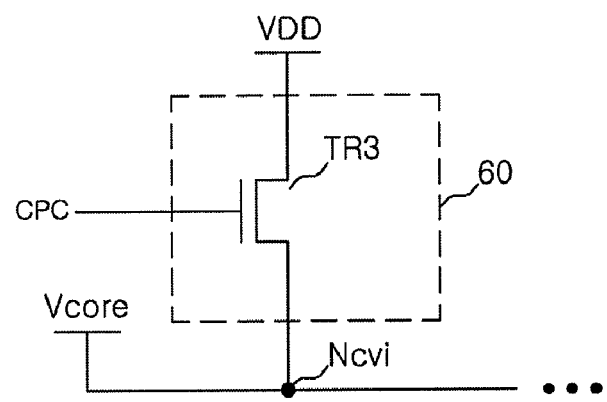
FIG. 6 is a circuit diagram of the power compensating unit shown in FIG. 2.

Referring to FIG. 6, the power compensating unit 60 includes a third transistor TR3 having a gate terminal receiving the compensation control signal CPC, a drain terminal applied with the external power source voltage VDD, and a source terminal coupled with the compensation voltage input node Ncvi.

While the compensation control signal CPC is enabled, the external power source voltage VDD is supplied to the compensation voltage input node Ncvi. Meanwhile, when the compensation control signal CPC is disabled, the third transistor TR3 interrupts the external power source voltage VDD to the compensation voltage input node Ncvi.

As aforementioned, by raising the level of power to be supplied into the sense-amp driver during the refresh mode in the semiconductor memory apparatus, it is possible to overcome the problem that the drivability of bit-line sensing is degraded by plural memory banks simultaneously using the core voltage Vcore. As such, during the refresh mode, the compensation control signal CPC is used to offset a drop in the core voltage Vcore to be supplied to the sense-amp driver, so it is able to charge a bit line up to the core voltage Vcore in a predetermined time.

Exemplary embodiments of the present invention enhance the drivability of a sense-amp driver by raising a voltage to be supplied to a sense amplifier during an active operation in a refresh mode, while reducing current dissipation even without an over-drive operation.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory apparatus, comprising:
   a compensation voltage input node;
   a core voltage generator configured to generate a core voltage using an external power source voltage and supply the core voltage to the compensation voltage input node;
   a compensation controlling unit configured to generate a compensation control signal to determine power compensation, in response to a refresh signal;
   a power compensating unit configured to selectively supply the external power source voltage to the compensation voltage input node in response to the compensation control signal; and
   a power supply unit configured to supply a voltage at the compensation voltage input node or the external power source voltage to a sense-amp driver in response to a first power control signal or a second power control signal.

2. The semiconductor memory apparatus as set forth in claim 1, wherein the compensation controlling unit is configured to generate the compensation control signal that is enabled at the time when the refresh signal is enabled, and is disabled after period of a predetermined time.

3. The semiconductor memory apparatus as set forth in claim 1, wherein the power compensating unit is configured to supply the external power source voltage to the compensation voltage input node when the compensation control signal is enabled, and interrupt the supplying the external power source voltage to the compensation voltage input node when the compensation control signal is disabled.

4. The semiconductor memory apparatus as set forth in claim 1, wherein the power supply unit is configured to supply the external power source voltage to the sense-amp driver when the first power control signal is enabled, and supply the voltage at the compensation voltage input node to the sense-amp driver when the second power control signal is enabled.

5. The semiconductor memory apparatus as set forth in claim 4, further comprising a power supply controlling unit configured to selectively enable the first power control signal or the second power control signal in response to the refresh signal or an active signal.

6. A semiconductor memory apparatus, comprising:
   a compensation voltage input node;
   a core voltage generator configured to generate a core voltage using an external power source voltage and supply the core voltage to the compensation input node;
   a power supply compensation unit configured to selectively supply the external power source voltage to the compensation voltage input node when an operating mode is a refresh mode; and a power supply unit configured to selectively supply a voltage at the compensation voltage input node or the external power source voltage to a sense-amp driver in response to a first power control signal or a second power control signal.

7. The semiconductor memory apparatus as set forth in claim 6, wherein the power supply compensation unit is configured to supply the external power source voltage to the compensation voltage input node during a predetermined time when the refresh signal is enabled, and interrupt the supplying the external power source voltage to the compensation voltage input node when the refresh signal is not enabled.

8. The semiconductor memory apparatus as set forth in claim 7, wherein the power supply compensation unit comprises:

a compensation controlling unit configured to generate a compensation control signal to determine power compensation, in response to the refresh signal; and a power compensating unit configured to selectively supply the external power source voltage to the compensation voltage input node in response to the compensation control signal.

9. The semiconductor memory apparatus as set forth in claim 8, wherein the power supply unit is configured to supply the external power source voltage to the sense-amp driver when the first power control signal is enabled, and supply the voltage at the compensation voltage input node to the sense-amp driver when the second power control signal is enabled.

10. The semiconductor memory apparatus as set forth in claim 6, further comprising a power supply controlling unit configured to selectively enable the first power control signal or the second power control signal in response to the refresh signal or an active signal.

* * * * *